(12) United States Patent
Atriss et al.

(10) Patent No.: US 6,909,393 B2
(45) Date of Patent: Jun. 21, 2005

(54) SPACE EFFICIENT LOW POWER CYCLIC A/D CONVERTER

(75) Inventors: Ahmad H. Atriss, Chandler, AZ (US); Steven P. Allen, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 74 days.

(21) Appl. No.: 10/631,450

(22) Filed: Jul. 30, 2003

(65) Prior Publication Data

US 2005/0024250 A1 Feb. 3, 2005

(51) Int. Cl.[7] .................................................. H03M 1/34
(52) U.S. Cl. ...................................... 341/163; 341/155
(58) Field of Search ................................ 341/155, 163, 341/122, 144, 161

(56) References Cited

U.S. PATENT DOCUMENTS

| | | | |
|---|---|---|---|
| 5,608,402 A | * 3/1997 | Distinti ........................ 341/162 |
| 5,644,313 A | 7/1997 | Rakers et al. ................ 341/163 |
| 5,995,035 A | * 11/1999 | Signell et al. ............... 341/163 |
| 6,127,958 A | * 10/2000 | Chang et al. ................ 341/155 |
| 6,380,806 B1 | * 4/2002 | Ang ............................. 330/258 |
| 6,535,157 B1 | * 3/2003 | Garrity et al. .............. 341/163 |
| 6,778,013 B1 | * 8/2004 | Ali ............................... 330/252 |

* cited by examiner

*Primary Examiner*—Peguy JeanPierre
(74) *Attorney, Agent, or Firm*—Ingrassia, Fisher & Lorenz, P.C.

(57) ABSTRACT

Methods and apparatus are provided for an analog converter. The apparatus comprises a first redundant signed digit (RSD) stage and a configurable block. The configurable block converts to a sample/hold circuit to sample a single ended analog signal. The sampled signal is then scaled, converted to a differential signal and provided to the first RSD stage. The first RSD stage outputs a bit value corresponding to the magnitude of the digital signal. In a next half clock cycle the first RSD stage calculates a residue that is provided to the configurable block. The configurable block is converted to a second redundant signed digit stage and generates a bit value corresponding to the magnitude of the residue provided by the first RSD stage. The first and second RSD stages cycle back and forth generating logic value each half clock cycle until the desired bit resolution is achieved. The configurable block is then converted back to a sample/hold circuit to start another conversion process.

15 Claims, 3 Drawing Sheets

US 6,909,393 B2

SPACE EFFICIENT LOW POWER CYCLIC A/D CONVERTER

TECHNICAL FIELD OF INVENTION

The present invention generally relates to analog to digital converters, and more particularly relates to redundant signed digit cyclical analog to digital converters.

BACKGROUND OF INVENTION

Digital signal processing has been proven to be very efficient in handling and manipulating large quantities of data. There are many products that are in common use such as wireless devices, digital cameras, motor controllers, automobiles, and toys, to name a few, that rely on digital signal processing to operate. Many of these products continuously receive information that is monitored and used to produce adjustments to the system thereby maintaining optimum performance. The data is often an analog signal that must be converted to a representative digital signal. For example, light intensity, temperature, revolutions per minute, air pressure, and power are but a few parameters that are often measured. Typically, an analog to digital (A/D) converter is the component used to convert an analog signal to a digital signal. In general, the conversion process comprises periodically sampling the analog signal and converting each sampled signal to a corresponding digital signal.

Many applications require the analog to digital converter(s) to sample at high data rates, operate at low power, and provide high resolution. These requirements are often contradictory to one another. Furthermore, cost is an important factor that directly correlates to the amount of semiconductor area needed to implement a design. One type of analog to digital converter that has been used extensively is a redundant signed digit (RSD) analog to digital converter. The RSD analog to digital converter typically comprises one or more RSD stages and a sample/hold circuit. In one embodiment, a sampled voltage is compared against a high reference voltage and a low reference voltage. The result of the comparison corresponds to an extracted bit (1 or 0) from the RSD stage. A residue voltage is then generated that relates to the sampled voltage less the voltage value of the extracted bit. The residue voltage is then provided to another RSD stage or fedback in a loop to continue the conversion process to extract bits until the least significant bit is generated. Typically, a RSD analog to digital converter uses an analog arithmetic unit known as a multiplying digital to analog converter or MDAC. The MDAC includes a high performance operational amplifier. Characteristics such as gain, bandwidth, and slew rate of the amplifier affect the settling time which determines the sampling speed of the analog to digital converter. The design of a high performance amplifier can take up a substantial amount of the space of a RSD analog to digital converter. The total power dissipated by the RSD analog to digital converter is closely linked to the amplifiers used in the circuit.

Accordingly, it is desirable to provide an analog to digital converter that operates at high clock rates. In addition, it is desirable to reduce the size of the analog to digital converter to lower the cost to manufacture. It would be also be beneficial to reduce power consumption. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
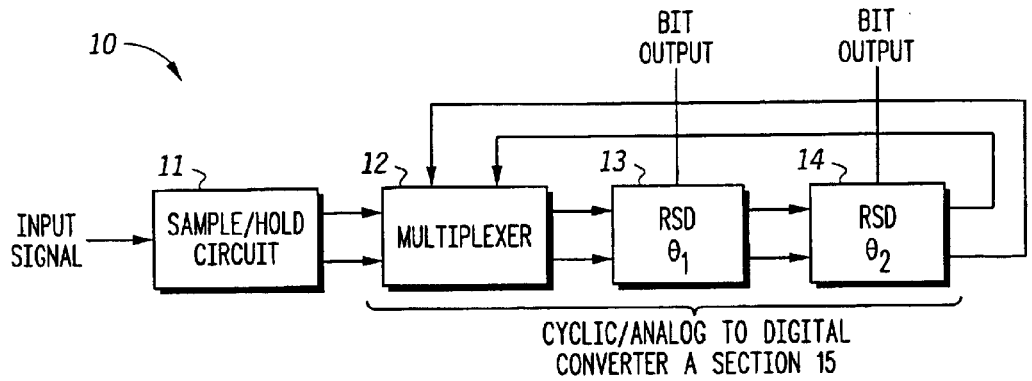
FIG. 1 is a block diagram of a prior art redundant signed digit (RSD) cyclical analog to digital converter.

FIG. 1 is a block diagram of a prior art redundant signed digit (RSD) cyclical analog to digital converter 10 having two RSD stages. In general, RSD cyclical analog to digital converter 10 is a clocked system that samples an analog voltage and generates a N-bit digital word representing the sampled analog voltage. The number of bits (N) of the digital word corresponds to the resolution of the conversion process and is chosen based on the application requirements. Typically, the complexity, size, and power of the converter goes up with speed of conversion and resolution.

RSD cyclical analog to digital converter 10 is suitable for many different types of applications and is widely used. RSD cyclical analog to digital converter 10 comprises sample/hold circuit 11 and a cyclic analog to digital converter section 15. Sample/hold circuit 11 has an input and a differential output. Sample/hold circuit 11 often performs many tasks. In one embodiment, sample/hold circuit 11 samples a single-ended analog voltage applied to the input and converts and scales the single-ended analog voltage to a differential voltage. When sampling a signal that can swing from the supply voltage to ground scaling is required to reduce the sampled analog voltage to a scaled valued that can be handled by cyclic analog to digital converter section 15. Converting to the differential voltage provides increased noise immunity for the rest of the conversion process.

Cyclic analog to digital converter section 15 comprises a multiplexer 12, a redundant signed digit (RSD) stage 13, and a redundant signed digit (RSD) stage 14. Multiplexer 12 has a first differential input coupled to the differential output of sample/hold circuit 11, a second differential input, and a differential output. RSD stage 13 has a differential input coupled to the differential output of multiplexer 12, a bit output, and differential output. RSD stage 14 has a differential input coupled to the differential output of RSD stage 13, a bit output, and a differential output coupled to the second differential input of multiplexer 12.

Operation of RSD cyclical analog to digital converter 10 begins with the input signal being sampled, scaled and converted to a differential signal by sample/hold circuit 11. Sample/hold circuit 11 provides the differential signal to cyclic analog to digital converter section 15. Multiplexer 12 couples the differential signal to RSD stage 13 where a first bit is extracted from the differential signal and provided at the bit output of RSD stage 13. The first bit (1 or 0) of the digital word representing the sampled input signal is stored. In an embodiment of RSD cyclical analog to digital converter 10, RSD stage 13 extracts a bit during $\phi_1$ of a clock cycle.

During $\phi_2$ of a clock cycle, a residue is calculated by RSD stage 13 and provided to RSD stage 14 where a second bit (1 or 0) is extracted from the residue and provided at the bit output of RSD stage 14. The second bit of the digital word representing the sampled input signal is stored. The differential signal provided by sample/hold circuit 11 is not needed after RSD stage 13 has received and processed the information. Multiplexer 12 is switched at an appropriate time such that the differential output of RSD stage 14 is coupled through multiplexer 12 to the differential input of RSD stage 13.

Cyclic analog to digital converter section 15 is now coupled in a cyclic mode where RSD stages 13 and 14 extract and provide a bit respectively during $\phi_1$ and $\phi_2$ of each clock cycle. For example, continuing with the example above, RSD stage 14 calculates a residue during $\phi_1$ of the next clock cycle and provides the residue to RSD stage 13 where a third bit is extracted and provided at the bit output of RSD stage 13. The third bit is stored. The process continues during $\phi_2$ of the clock cycle where the fourth bit is extracted until the N bits of resolution of RSD cyclical analog to digital converter 10 have been generated corresponding to the initial sampled voltage wherein the input signal is sampled again to start another conversion process. Thus, a redundant signed digit cyclical analog to digital converter provides a nice compromise between power consumption, speed at which the conversion takes place, resolution, and chip area.

Figure 2:
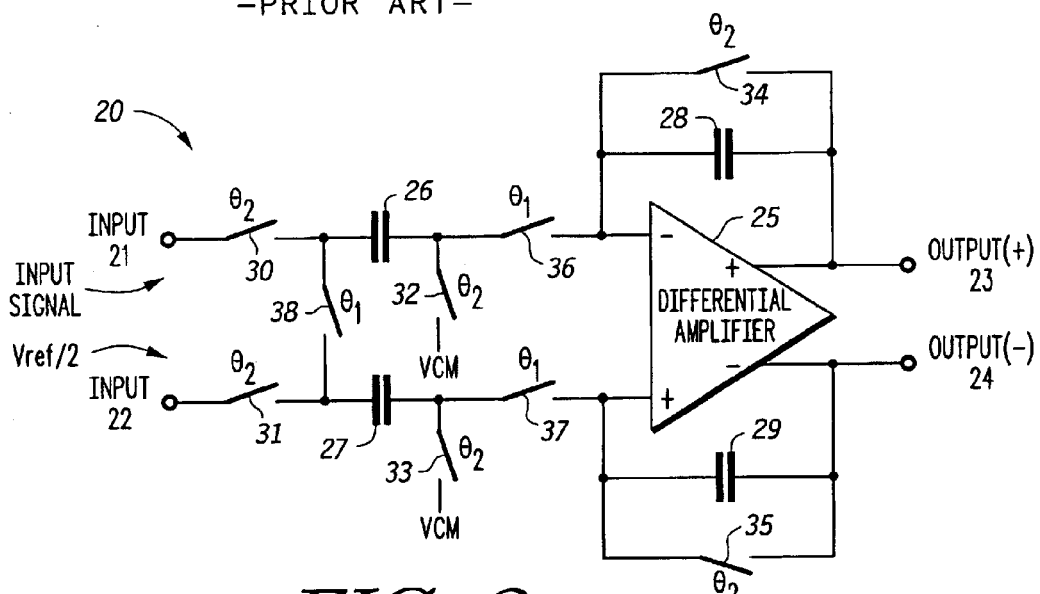
FIG. 2 is a schematic diagram of a prior art sample/hold circuit.

FIG. 2 is a schematic diagram of a prior art sample/hold circuit 20 that is capable of sampling a single-ended analog voltage, scaling the sampled voltage, and converting to the sampled single-ended analog voltage to a differential voltage. Sample/hold circuit 20 has an input 21, an input 22, an output 23, and an output 24. Sample/hold circuit 20 comprises a differential amplifier 25, capacitors 26–29, and switches 30–38. Switches 30–38 of sample/hold circuit 20 are primarily controlled by a clock signal. The phase of the clock signal indicating a closed switch is located by switches 30–38. Switches 30–38 are open during an opposite clock phase (not shown by each switch). $\phi_2$ corresponds to a first half clock cycle. $\phi_1$ corresponds to a second half clock cycle.

Sample/hold circuit 20 is configured to sample the input signal applied to input 21 during $\phi_2$ of the clock cycle. Switches 30–35 are closed during $\phi_2$ of the clock cycle. Switch 30 has a first terminal coupled to input 21 and a second terminal. Capacitor 26 has a first terminal coupled to the second terminal of switch 30 and a second terminal. Switch 32 has a first terminal coupled to the second terminal of capacitor 26 and a second terminal coupled for receiving a reference voltage VCM. Switch 31 has a first terminal coupled to input 22 and a second terminal. Capacitor 27 has a first terminal coupled to the second terminal of switch 31 and a second terminal. Switch 33 has a first terminal coupled to the second terminal of capacitor 27 and a second terminal coupled for receiving a reference voltage VCM. Switch 34 has a first terminal coupled to a negative input of differential amplifier 25 and a second terminal coupled to the positive output of differential amplifier 25. Switch 35 has a first terminal coupled to a positive input of differential amplifier 25 and a second terminal coupled to the negative output of differential amplifier 25.

Capacitor 26 stores a difference voltage between the input signal applied to input 21 and the reference voltage VCM. Similarly, capacitor 27 stores a difference voltage between a reference voltage $V_{ref}/2$ and the reference voltage VCM. The voltages stored on capacitors 26 and 27 during $\phi_2$ are used to scale and convert the single-ended signal analog signal applied to input 21 to a differential signal.

Capacitors 26 and 27 are decoupled respectively from input 21 and input 22 when the clock signal changes phase from $\phi_2$ to $\phi_1$. Switches 30–35 are now open and switches 36–38 are now closed. Switch 38 has a first terminal coupled to the first terminal of capacitor 26 and a second terminal coupled to the first terminal of capacitor 27. Switch 36 has a first terminal coupled to the second terminal of capacitor 26 and a second terminal coupled to the negative input of differential amplifier 25. Switch 37 has a first terminal coupled to the second terminal of capacitor 26 and a second terminal coupled to the positive input of differential amplifier 25. Capacitors 26 and 27 are placed in series between the positive and negative inputs of differential amplifier 25. Capacitor 28 has a first terminal coupled to the negative input of differential amplifier 25 and a second terminal coupled to the positive output of differential amplifier 25. Capacitor 29 has a first terminal coupled to the positive input of differential amplifier 25 and a second terminal coupled to the negative output of differential amplifier 25.

Differential amplifier 25 scales and produces a differential signal corresponding to the single-ended analog signal that was sampled during $\phi_2$ of the clock cycle. Differential amplifier 25 scales corresponding to a ratio of capacitors 26 and 28 and capacitors 27 and 29 during $\phi_1$ of the clock cycle. The voltage being amplified is the net voltage across series connected capacitors 26 and 27. The differential voltage output is provided at outputs 23 and 24.

Figure 3:
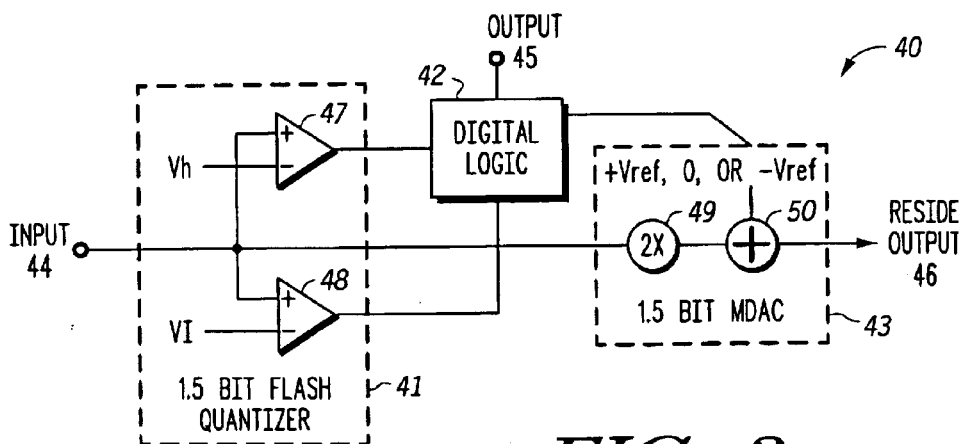
FIG. 3 is a block diagram of a redundant signed digit (RSD) stage.

FIG. 3 is a block diagram of a redundant signed digit (RSD) stage 40. RSD stage 40 comprises a 1.5 bit flash quantizer 41, digital logic 42, and a 1.5 bit multiplying digital to analog converter (MDAC) 43. RSD stage 40 has an input 44, a bit output 45, and a residue output 46. RSD stage 40 produces a logic bit (1 or 0) depending on the magnitude of an input signal and calculates a residue. The residue is the remainder of the input signal less the value of the logic bit produced by RSD stage 40. The residue is typically the input signal to the next RSD stage. In general, the residue is amplified by a factor of 2 to allow 1.5 bit flash quantizer 41 to be the same for each RSD stage used. The creation of the digital word corresponding to a sampled voltage is generated by a RSD analog to digital converter by sequentially generating bits from the most significant bit (MSB) to the least significant bit (LSB).

RSD stage 40 is a 1.5 bit stage where 0.5 bit redundancy is used for digital correction to reduce comparator (offset) requirements. RSD stage 40 immediately generates an output bit upon receiving an input signal or residue. Digital logic 42 and 1.5 bit flash quantizer 41 determines whether the magnitude of the input signal corresponds to a logic one or a logic zero. 1.5 bit flash quantizer 41 comprises a comparator 47 and a comparator 48. Comparator 47 has a positive input coupled to input 44, a negative input coupled to a reference voltage $V_h$ and an output. Comparator 47 outputs a logic one if the input signal applied to input 44 is greater than $V_h$ and outputs a logic zero if the input signal is less than $V_h$. Comparator 48 has a positive input coupled to input 44, a negative input coupled to a reference voltage $V_l$ and an output. Comparator 48 outputs a logic one if the input signal applied to input 44 is greater than $V_l$ and outputs a logic zero if the input signal is less than $V_l$. Digital logic 42 has a first input coupled to the output of comparator 47, a second input coupled to the output of comparator 48, a first output coupled to bit output 45, and a second output. Three possible outputs can be generated from comparators 47 and 48 to digital logic 42. Digital logic 42 immediately provides a logic value to bit output 45 corresponding to the input signal magnitude.

The 1.5 bit multiplying analog to digital converter (MDAC) 43 is the core of RSD stage 40. 1.5 bit MDAC 43 calculates the analog residue signal that is typically used as the input signal of the next RSD stage. As mentioned previously, the residue is amplified (typically 2x) by 1.5 bit MDAC 43. 1.5 bit MDAC 43 comprises an amplification stage 49 and a sum stage 50. Amplification stage 49 has an input coupled to input 44 and an output. Sum stage 50 has a first input coupled to the output of amplification stage 49 and a second input coupled to the second output of digital logic 42, and an output coupled to residue output 46.

The speed at which RSD stage 40 operates, in part, is related to the performance of amplification stage 49. Typically, RSD stage 40 operates within a clock cycle whereby the bit value of the sampled input signal is provided at output bit 45 during a first phase of a clock cycle and the residue is calculated and provided at residue output 46 during a second phase of a clock cycle. The speed of operation is often limited by the settling time of the amplifier used in amplification stage 49. The output of amplification stage 49 must settle before a time period equal to a half clock cycle. Settling time is a function of slew rate and the gain bandwidth of the amplifier. In general, the amplifier used in amplification stage 49 is a high quality amplifier design that takes up significant wafer area and often consumes a substantial amount of the integrated circuit total power dissipation.

Sum stage 50 sums the signal received from amplification stage 49 and digital logic 42. Digital logic 42 provides a voltage $V_{ref}$, 0, or $-V_{ref}$ to sum stage 50. The value provided by digital logic 42 is determined by the output from comparators 47 and 48. The accuracy of the conversion process is greatly impacted by the ability of 1.5 bit MDAC 43 to calculate the residue.

Figure 4:
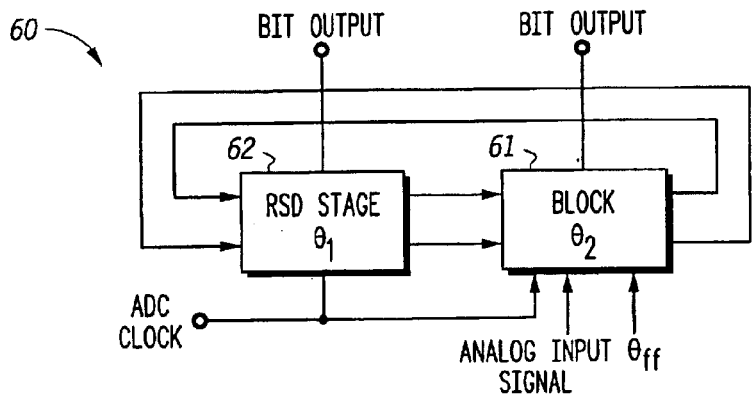
FIG. 4 is a block diagram of a two stage redundant (RSD) cyclical analog to digital converter in accordance with the present invention.

FIG. 4 is a block diagram of a two stage redundant signed digit (RSD) cyclical analog to digital converter 60 in accordance with the present invention. RSD cyclical analog to digital converter 60 comprises a block 61 and a RSD stage 62. Block 61 has a differential input, an input coupled for receiving an analog input signal, a control input for receiving a $\theta_{ff}$ signal, a clock input coupled for receiving an analog to digital converter (ADC) clock signal, a bit output, and a differential output. RSD stage 62 comprises a differential input coupled to the differential output of block 61, a clock input coupled for receiving the ADC clock signal, a bit output, and a differential output coupled to the differential input of block 61.

RSD cyclical analog to digital converter 60 reduces both power and area when compared to a standard RSD analog to digital converter. In particular, RSD cyclical analog to digital converter 60 combines the functions of the sample/hold circuit and the second RSD stage into a block 61. The sample/hold circuit is used only once per conversion cycle yet takes up almost a third of the space and power of a RSD analog to digital converter. RSD cyclical analog to digital converter 60 takes advantage of the fact that the logic bit value and the residue are generated during different phases of the clock signal. RSD stage 62 is used to generate the first logic value or the most significant bit (MSB). Thus, block 61 is configured as a sample/hold circuit to provide RSD stage 62 with a sampled signal thereby generating the first logic value. Block 61 is then reconfigured as a second RSD stage as RSD stage 62 calculates a residue. It should be noted that at least one component in block 61 is shared between the sample/hold circuit and RSD stage configurations of block 61. The timing of this configuration-reconfiguration process will be described in more detail hereinbelow.

In general, block 61 is configured to a sample/hold circuit when enabled by the $\theta_{ff}$ signal. The sample/hold circuit, samples, scales, and converts a sampled single-ended analog signal to a differential signal. The differential output of block 61 provides the differential signal to RSD stage 62 for determining a first logic bit value (most significant bit) that is provided at the bit output of RSD stage 62.

Figure 5:
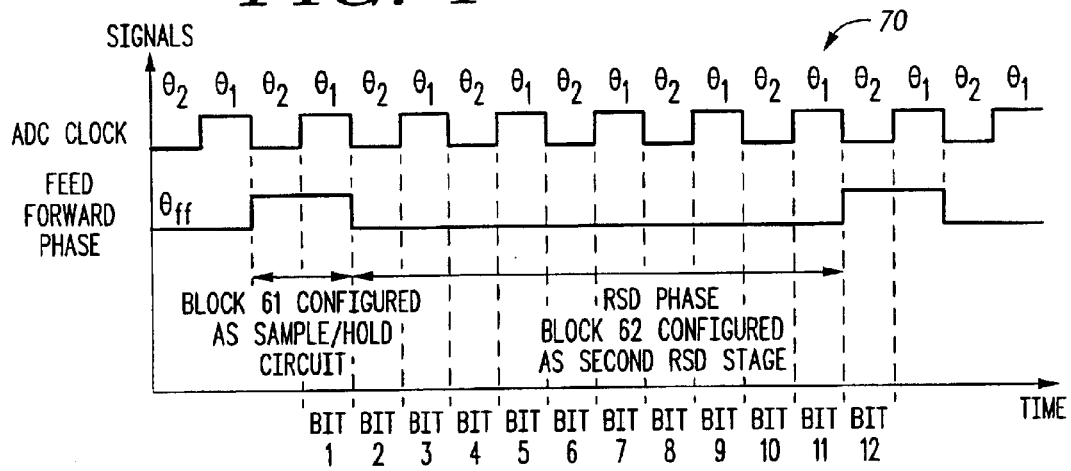
FIG. 5 is a timing diagram for the two stage redundant (RSD) cyclical analog to digital converter of FIG. 4.

FIG. 5 is a timing diagram 70 for the two stage redundant (RSD) cyclical analog to digital converter of FIG. 4. Timing diagram 70 is a conversion process that generates a 12 bit digital word corresponding to a sampled analog signal. The resolution of the conversion is a function of the number of clock cycles used. The analog to digital converter (ADC) clock signal is shown having a phase $\theta_1$ and a phase $\theta_2$. Referring to FIG. 4, the $\theta_1$ on RSD stage 62 indicates that a logic bit value is provided at the bit output of RSD stage 62 on the phase $\theta_1$ of the clock signal. Similarly, the $\theta_2$ on block 61 indicates that a logic bit value is provided at the bit output of block 61 on the phase $\theta_2$ of the clock signal.

Referring back to FIG. 5, the $\theta_{ff}$ signal transitioning to a high logic state begins a conversion process. In one embodiment, the $\theta_{ff}$ signal is in the high logic state for a full ADC clock signal. The $\theta_{ff}$ signal configures block 61 to a sample/hold circuit. The sample/hold circuit samples the analog input signal during the first half ($\theta_2$) of the $\theta_{ff}$ signal. In an embodiment of the sample/hold circuit, the sampled single-ended analog voltage is scaled and converted to a differential signal during the second half ($\theta_1$) of the $\theta_{ff}$ signal. The differential signal is immediately provided from block 61 (FIG. 4) to RSD stage 62 (FIG. 4) where the first logic value (bit 1) is generated and output on the bit output of RSD stage 62 (FIG. 4). As shown, this occurs during $\theta_1$ while the $\theta_{ff}$ signal is in a high logic state. In general, a logic bit value is generated each half clock of the ADC clock signal.

The $\theta_{ff}$ signal transitions to a low logic state during the phase $\theta_2$ of the next ADC clock signal. Block 61 is configured from the sample/hold circuit to a RSD stage. Block 61 stays as the RSD stage during the conversion process. RSD stage 62 (FIG. 4) calculates a residue and provides the residue to the newly reconfigured RSD stage of block 61. The RSD stage of block 61 (FIG. 4) immediately outputs the second logic value (bit 2) on the bit output of block 61 (FIG. 4). The RSD stage of block 61 (FIG. 4) then calculates a residue during the next phase $\theta_1$ of ADC clock signal. The residue from the RSD stage of block 61 is provided to RSD stage 62 (FIG. 4) where a third logic value is generated and output. Thus, the generation of a logic value and calculating a residue occurs back and forth between RSD stage 62 (FIG. 4) and the RSD stage of block 61.

As mentioned previously, the timing diagram illustrates a 12 bit conversion. The $\theta_{ff}$ signal transitions from the low logic state to a high logic state after the eleventh logic value (bit 11) is generated. The $\theta_{ff}$ signal transitions to the high logic state during a phase $\theta_2$ of the ADC clock signal. Block 61 (FIG. 4) is reconfigured from the RSD stage to the sample/hold circuit when the $\theta_{ff}$ signal transitions to the high logic state. On going with the reconfiguration of block 61 (FIG. 4), is the calculation of the residue by RSD stage 62 (FIG. 4). The residue from RSD stage 62 is provided to block 61 (FIG. 4) where the twelfth logic value (bit 12) is generated and provided at the bit output of block 61. The reason why the logic value can be generated by block 61 (FIG. 4) while it is being configured as a sample/hold circuit is that the circuitry pertaining to determine the logic value is unaffected by the configuration change. In one embodiment, most of the change occurs in the circuitry involved with the calculation of the residue which is not needed after the least significant bit is generated.

Figure 6:
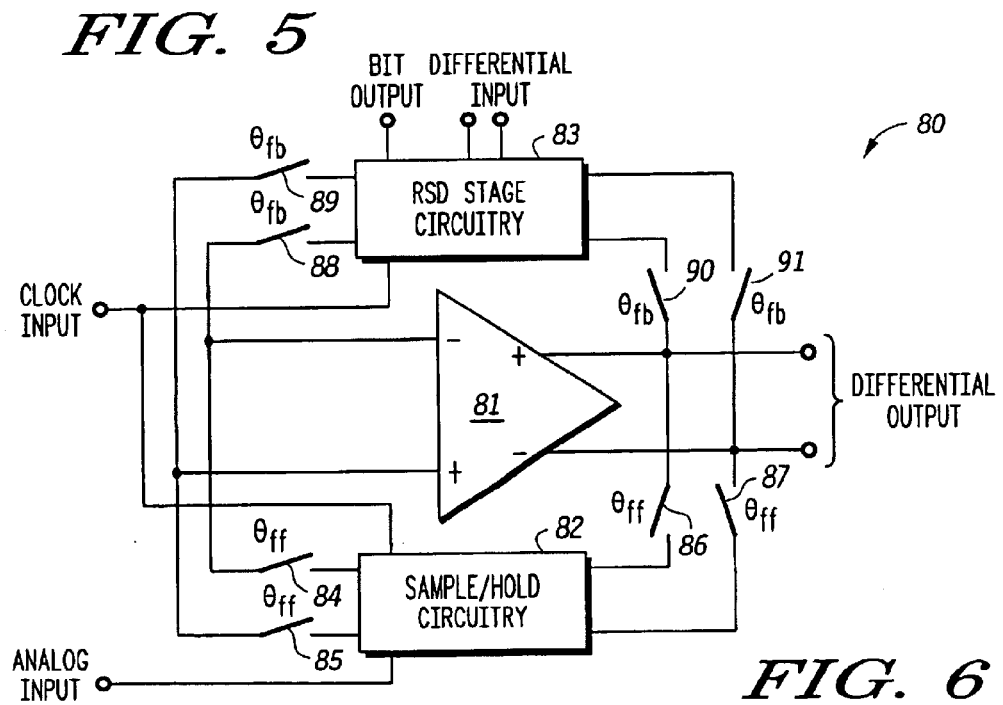
FIG. 6 is a block that is configurable to both a sample/hold circuit and a RSD stage in accordance with the present invention.

FIG. 6 is a block 80 that is configurable to both a sample/hold circuit and a redundant signed digit (RSD) stage in accordance with the present invention. Block 80 is one embodiment of block 61 of FIG. 4. In particular, block 80 switchably couples an amplifier 81 for use in the sample/hold circuit and as the RSD stage. In this embodiment, no other circuitry is shared other than amplifier 81 for the two different circuit configurations. In general, a sample/hold circuit and a RSD stage both require a high performance amplifier. An amplifier takes up a substantial amount of chip area and is a significant source of power dissipation. Sharing an amplifier for both the sample/hold circuit and the RSD stage produces a large area and power savings for an analog to digital converter. For example, it is possible to reduce the size and power dissipation of a two stage RSD cyclical analog to digital converter by approximately 33% using shared components.

Block 80 comprises amplifier 81, sample/hold circuitry 82, RSD stage circuitry 83, and switches 84–91. Block 80 has a clock input for receiving a clock signal, an analog input for receiving an analog signal, a bit output, a differential output, a control input $\theta_{ff}$ (not shown), and a control input $\theta_{fb}$ (not shown). In an embodiment of block 80, sample/hold circuitry 82 comprises components such as switches and capacitors that are commonly used around a high performance amplifier to sample a single-ended analog signal, scale, and convert to a differential signal. Similarly, RSD stage circuitry 83 comprises components such as switches, capacitors, and digital logic that when placed around amplifier 81 produce a logic value corresponding to a sampled input signal and calculates a residue.

Sample/hold circuitry 82 has a first input coupled to the analog input, a second input coupled to the clock input, a first terminal, a second terminal, a third terminal, and a fourth terminal. Switch 84 has a first terminal coupled to the first terminal of sample/hold circuitry 82 and a second terminal coupled to a negative input of amplifier 81. Switch 85 has a first terminal coupled to the second terminal of sample/hold circuitry 82 and a second terminal coupled to a positive input of amplifier 81. Switches 84 and 85 couple sample/hold circuitry 82 to the differential inputs of amplifier 81. Switch 86 has a first terminal coupled to the third terminal of sample/hold circuitry 82 and a second terminal coupled to a positive output of amplifier 81. Switch 87 has a first terminal coupled to the fourth terminal of sample/hold circuit 82 and a second terminal coupled to a negative output of amplifier 81. Switches 86 and 87 couple sample/hold circuitry 82 to the differential outputs of amplifier 81.

Switches 84–87 are enabled by a $\theta_{ff}$ control signal applied to the $\theta_{ff}$ control input of block 80. The $\theta_{ff}$ control signal couples the sample/hold circuitry to amplifier 81. In an embodiment of block 80, the $\theta_{ff}$ control signal is enabled for a clock cycle of a clock signal applied to the clock input. A $\theta_{fb}$ signal is in a logic state that disables switches 88–91. A sample of the analog signal applied to the analog input is taken during a first phase of the clock cycle when switches 84–87 are enabled. A scaled differential signal corresponding to the sampled analog signal is provided at the differential output of block 80 during the second phase of the clock cycle when switches 84–87 are enabled.

RSD stage circuitry 83 has an input coupled to the clock input, a differential input coupled to the differential input of block 80, a first terminal, a second terminal, a third terminal, a fourth terminal, and a bit output. Switch 88 has a first terminal coupled to the first terminal of RSD stage circuitry 83 and a second terminal coupled to the negative input of amplifier 81. Switch 89 has a first terminal coupled to the second terminal of RSD stage circuitry 83 and a second terminal coupled to the positive input of amplifier 81. Switches 88 and 89 coupled RSD stage circuitry 83 to the differential inputs of amplifier 81. Switch 90 has a first terminal coupled to the third terminal of RSD stage circuitry 83 and a second terminal coupled to the positive output of amplifier 81. Switch 91 has a first terminal coupled to the fourth terminal of RSD stage circuitry 83 and a second terminal coupled to the negative output of amplifier 81. Switches 90 and 91 couple RSD stage circuitry 83 to the differential outputs of amplifier 81.

Switches 88–91 are enabled by a $\theta_{fb}$ control signal applied to the $\theta_{fb}$ control input of block 80. The $\theta_{fb}$ control signal couples the RSD stage circuitry 83 to amplifier 81. In an embodiment of block 80, the $\theta_{fb}$ control signal is typically enabled for multiple clock cycles or until the analog to digital conversion process is completed. The $\theta_{ff}$ signal is in a logic state that disables switches 84–87 and $\theta_{fb}$ signals are typically enabled at this time. In an embodiment of block 80, a logic value is generated during a phase of the clock cycle when a differential signal is applied to the differential input of block 80 and the $\theta_{fb}$ signal enables switches 88–91. A residue is calculated and provided at the differential output of block 80 during a next phase of the clock cycle and switches 88–91 are enabled.

Figure 7:
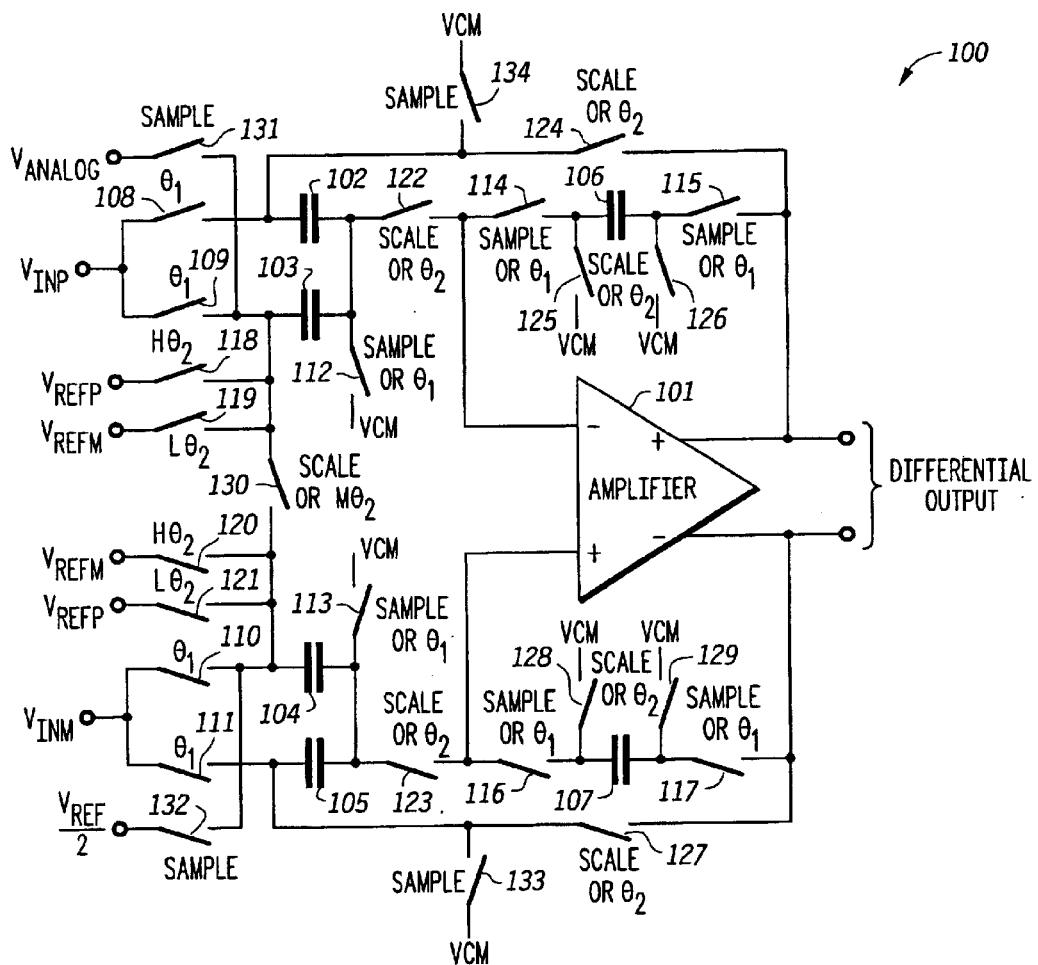
FIG. 7 is a schematic diagram of a configurable block in accordance with the present invention.

FIG. 7 is a schematic diagram of a configurable block 100 in accordance with the present invention. Configurable block 100 is configurable as a sample/hold circuit and a 1.5 bit multiplying digital to analog converter (MDAC). Typically, the MDAC takes up the majority of the silicon area of a redundant signed digit stage. Configurable block 100 is related to block 61 of FIG. 4 except that some components of a redundant signed digit stage, for example a flash quantizer and some digital logic are not shown to simplify the illustration since it is not among the shared circuitry of the two different circuit configurations (sample/hold circuit and 1.5 bit MDAC). In this embodiment, configurable block 100, unlike redundant signed digit stage 80 of FIG. 6, reuses more than the amplifier. Configurable block 100 shares other elements such as capacitors which take up a significant area in both the sample/hold circuit and the 1.5 bit MDAC thereby further increasing the area efficiency. Configurable block 100 has a first input coupled for receiving a $V_{analog}$ signal, a second input for receiving a $V_{refp}$ signal, a third input for receiving a $V_{refm}$ signal, a fourth input for receiving a $V_{inp}$ signal, a fifth input for receiving a $V_{inm}$ signal, a sixth input for receiving a VCM voltage, and a differential output. Configurable block 100 comprises an amplifier 101, capacitors 102–107, and switches 108–134. Switches 108–111 are enabled (closed) during a phase $\theta_1$ of a RSD stage2 clock signal. Switches 112–117 are enabled (closed) during the phase $\theta_1$ of the RSD stage2 clock signal or by a sample signal. Switches 118–121 are enabled (closed) during a phase $\theta_2$ of the RSD stage2 clock signal. Switches 122–129 are enabled (closed) during the phase $\theta_2$ of the RSD stage2 clock signal or by a scale signal. Switch 130 is enabled (closed) when both a signal $M\theta_2$ (is in an enable logic state) and the RSD stage2 clock signal is in the phase $\theta_2$. Switches 131–134 are enabled (closed) by the sample signal. The enabling signal is indicated in FIG. 7 by each of the switches 108–134.

Configurable block 100 is configured to sample when switches 112–117 and switches 131–134 are enabled. Switch 131 has a first terminal coupled to the first input ($V_{Ref/2}$ signal) of configurable block 100 and a second terminal. A capacitor 103 has a first terminal coupled to the second terminal of switch 131 and a second terminal. A switch 112 has a first terminal coupled to the second terminal of capacitor 103 and a second terminal coupled to the sixth input (VCM voltage) of configurable block 100. A capacitor 102 has a first terminal coupled to the first terminal of switch 112 and a second terminal. A switch 134 has a first terminal coupled to the second terminal of capacitor 102 and a second terminal coupled to the sixth input (VCM voltage) of configurable block 100.

Switch 132 has a first terminal coupled to the first input ($V_{analog}$ signal) of configurable block 100 and a second terminal. A capacitor 104 has a first terminal coupled to the second terminal of switch 132 and a second terminal. A switch 113 has a first terminal coupled to the second terminal of capacitor 104 and a second terminal coupled to the sixth input (VCM voltage) of configurable block 100. A capacitor 105 has a first terminal coupled to the first terminal of switch 113 and a second terminal. A switch 133 has a first terminal coupled to the second terminal of capacitor 105 and a second terminal coupled to the sixth input (VCM voltage) of configurable block 100.

Switch 114 has a first terminal coupled to a negative input of amplifier 101 and a second terminal. Capacitor 106 has a first terminal coupled to the second terminal of switch 114 and a second terminal. Switch 115 has a first terminal coupled to the second terminal of capacitor 106 and a second terminal coupled to the output a positive input of amplifier 101. Switch 116 has a first terminal coupled to a positive input of amplifier 101 and a second terminal. Capacitor 107 has a first terminal coupled to the second terminal of switch 116 and a second terminal. Switch 117 has a first terminal coupled to the second terminal of capacitor 107 and a second terminal coupled to a negative output of amplifier 101.

Configurable block 100 is configured to scale and provide a differential voltage corresponding to a sampled analog signal when switches 122–129 are enabled. Switch 122 has a first terminal coupled to the negative input of amplifier 101 and a second terminal coupled to the first terminal of switch 112. Switch 124 has a first terminal coupled to the first terminal of switch 134 and a second terminal coupled to the positive output of amplifier 101. Switch 125 has a first terminal coupled to the first terminal of capacitor 106 and a second terminal coupled to the sixth input (VCM voltage) of configurable block 100. Switch 126 has a first terminal coupled to the second terminal of capacitor 106 and a second terminal coupled to the sixth input (VCM voltage) of configurable block 100.

Switch 123 has a first terminal coupled to the positive input of amplifier 101 and a second terminal coupled to the first terminal of switch 113. Switch 127 has a first terminal coupled to the second terminal of capacitor 105 and a second terminal coupled to the negative output of amplifier 101. Switch 128 has a first terminal coupled to the first terminal of capacitor 107 and a second terminal coupled to the sixth input (VCM voltage) of configurable block 100. Switch 129 has a first terminal coupled to the second terminal of capacitor 107 and a second terminal coupled to the sixth input (VCM voltage) of configurable block 100.

After sampling, scaling, and converting an input analog signal to a differential signal, configurable block 100 is configured as a 1.5 bit MDAC and works in conjunction with other circuitry to form a redundant signed bit (RSD) stage of an analog to digital (A/D) converter that participates in an analog to digital conversion. In an embodiment of configurable block 100, the RSD stage is a second RSD stage of a two stage RSD analog to digital converter. In general, configurable block 100 as the second RSD stage generates a logic bit value corresponding to the magnitude of a differential input signal during a phase $\theta_1$ of the RSD stage2 clock signal. The second RSD stage then generates a residue during a phase $\theta_2$ of the RSD stage2 clock signal.

Switches 108–117 are enabled when configurable block 100 is configured as a 1.5 bit MDAC and a logic bit value is being generated. Switch 108 has a first terminal coupled to the fourth input ($V_{inp}$ signal) of configurable block 100 and a second terminal coupled to the second terminal of capacitor 102. Switch 109 has a first terminal coupled to the fourth input ($V_{inp}$ signal) of configurable block 100 and a second terminal coupled to the first terminal of capacitor 103. Switch 112 has the first terminal coupled to the first terminal of capacitor 102 and the second terminal coupled to the sixth input (VCM voltage) of configurable block 100. Switch 114 has the first terminal coupled to a negative input of amplifier 101 and the second terminal coupled to the first terminal of capacitor 106. Switch 115 has the first terminal coupled to the second terminal of capacitor 106 and a second terminal coupled to the output a positive input of amplifier 101.

Switch 110 has a first terminal coupled to the fifth input ($V_{inm}$ signal) of configurable block 100 and a second terminal coupled to the first terminal of capacitor 104. Switch 111 has a first terminal coupled to the fifth input ($V_{inm}$ signal) of configurable block 100 and a second terminal coupled to the second terminal of capacitor 105. Switch 113 has the first terminal coupled to the second terminal of capacitor 104 and a second terminal coupled to the sixth input (VCM voltage) of configurable block 100. Switch 116 has the first terminal coupled to a positive input of amplifier 101 and the second terminal coupled to the first terminal of capacitor 107. Switch 117 has the first terminal coupled to the second terminal of capacitor 107 and the second terminal coupled to the negative output of amplifier 101.

Switches 118–129 are enabled when configurable block 100 is configured as a 1.5 bit MDAC and a residue is being generated. Switch 118 has a first terminal coupled to the second input ($V_{refp}$ signal) of configurable block 100 and a second terminal coupled to the first terminal of capacitor 103. Switch 119 has a first terminal coupled to the third input ($V_{refm}$ signal) of configurable block 100 and a second terminal coupled to the first terminal of capacitor 103. Switch 122 has the first terminal coupled to the negative input of amplifier 101 and the second terminal coupled to the first terminal of switch 112. Switch 124 has the first terminal coupled to the first terminal of switch 134 and the second terminal coupled to the positive output of amplifier 101. Switch 125 has the first terminal coupled to the first terminal of capacitor 106 and the second terminal coupled to the sixth input (VCM voltage) of configurable block 100. Switch 126 has the first terminal coupled to the second terminal of capacitor 106 and the second terminal coupled to the sixth input (VCM voltage) of configurable block 100.

Switch 120 has a first terminal coupled to the third input ($V_{refm}$ signal) of configurable block 100 and a second terminal coupled to the first terminal of capacitor 104. Switch 121 has a first terminal coupled to the second input ($V_{refp}$ signal) of configurable block 100 and a second terminal coupled to the first terminal of capacitor 104. Switch 123 has the first terminal coupled to the positive input of amplifier 101 and the second terminal coupled to the first terminal of switch 113. Switch 127 has the first terminal coupled to the second terminal of capacitor 105 and the second terminal coupled to the negative output of amplifier 101. Switch 128 has the first terminal coupled to the first terminal of capacitor 107 and the second terminal coupled to the sixth input (VCM voltage) of configurable block 100. Switch 129 has the first terminal coupled to the second terminal of capacitor 107 and the second terminal coupled to the sixth input (VCM voltage) of configurable block 100.

Figure 8:
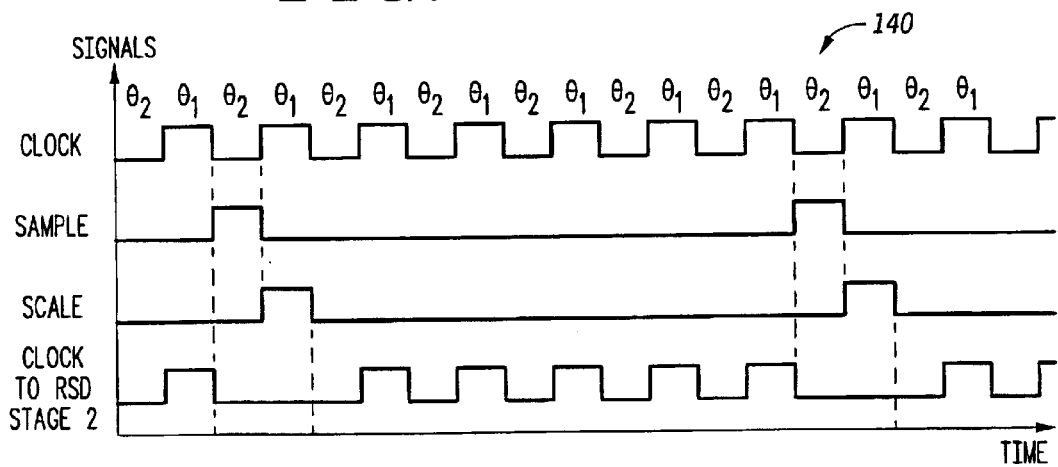
FIG. 8 is a timing diagram for illustrating an operation of the configurable block of FIG. 7.

FIG. 8 is a timing diagram 140 for illustrating an operation of configurable block 100 of FIG. 7. Timing diagram 140 simulates configurable block 100 (FIG. 7) as if it were part of two stage redundant signed digit (RSD) analog to digital converter such as that shown in FIG. 4. The clocking sequence of timing diagram 140 shows a typical conversion cycle where an analog signal is sampled followed by the generation of the logic bits that forms a digital word corresponding to the sampled analog signal. The clock to RSD stage2 signal has a phase $\theta_1$ that enables switches 108–117 and disables switches 118–130 and a phase $\theta_2$ that enables switches 118–130 and disables switches 108–130 of configurable block 100 (FIG. 7).

The conversion cycle begins with the sample signal transitioning from a low logic state to a high logic state. Referring back to FIG. 7, configurable block 100 is configured as a sample/hold circuit. The sample/hold circuit is in a sample mode. The sample signal enables switches 112–117 and 131–134. Configurable block 100 samples the $V_{analog}$ signal applied to the first input of configurable block 100. In particular, capacitors 103 and 104 store a voltage that is the difference between the $V_{analog}$ signal and the VCM voltage. The VCM voltage is a common mode or reference voltage. The first and second terminals of capacitors 102 and 105 are coupled to the VCM voltage thus storing no voltage. Amplifier 101 is placed in a configuration where capacitor 106 is coupled between the negative input and the positive output of amplifier 101. Also, capacitor 107 is coupled between the positive input and negative output of amplifier 101.

Referring back to FIG. 8, the sample signal transitions from the high logic state to a low logic state removing configurable block 100 from the sample mode. The scale signal transitions from a low logic state to a high logic state. Referring back to FIG. 7, the scale signal enables switches 122–129. Configurable block 100 is still the sample/hold circuit but is in a scale mode. Capacitors 106 and 107 are decoupled from amplifier 101. The first and second terminals of capacitors 106 and 107 are coupled to the VCM voltage thus storing no voltage. Capacitor 102 is coupled between the negative input and the positive output of amplifier 101. Capacitor 105 is coupled between the positive input and the negative output of amplifier 101. Capacitors 102 and 105 have no voltage stored on them. Capacitor 103 and capacitor 104 are coupled in series. Capacitor 103 is coupled to the negative input of amplifier 101. Capacitor 104 is coupled to the positive input of amplifier 101. Amplifier 101 and capacitors 102–105 are in a configuration where the sampled $V_{analog}$ signal is scaled and converted to a differential signal provided at the differential output of configurable block 100. The differential signal generated while configurable block 100 is converted to the sample/hold circuit would be provided to a first RSD stage (not shown) for determining a first logic value using the example of configurable block 100 being part of the two stage RSD cyclical analog to digital converter.

Referring back to FIG. 8, the clock to RSD stage 2 signal is in a low logic state while configurable block 100 is configured as the sample/hold circuit. The scale signal transitions from the high logic state to a low logic state. The clock to RSD stage2 signal begins clocking, beginning with phase $\theta_1$ followed by phase $\theta_2$ and repeating thereafter. The phase $\theta_1$ is a low logic state. Referring back to FIG. 7, configurable block 100 is configured as a 1.5 bit multiplying analog to digital converter (MDAC). The clock to RSD stage2 signal in phase $\theta_1$ enables switches 108–117. Configurable block 100 implemented as a major part of the second RSD stage of the RSD cyclical to analog converter has time for the change from the sample/hold circuit to the second RSD stage (1.5 bit MDAC). The second RSD stage would first receive a residue from the first RSD stage from which a logic bit value would be determined by the second RSD stage during phase $\theta_1$ of the clock to RSD stage2 signal.

The second RSD stage generates a bit value upon receiving a residue voltage from the first RSD stage (not shown). The residue voltage (which is a differential voltage) is provided to the fourth ($V_{inp}$ signal) and fifth ($V_{inm}$ signal) inputs of configurable block 100 during phase $\theta_1$. A difference voltage corresponding to the difference between the $V_{inp}$ signal and the VCM voltage is stored on both capacitors 102 and 103. A difference voltage corresponding to the difference between the $V_{inm}$ signal and the VCM voltage is stored on both capacitors 104 and 105. Optionally, configurable block 100 can be modified to add circuitry to cancel the offset voltage of amplifier 101.

Configurable block 100 remains as the 1.5 bit MDAC as clock to RSD stage 2 transitions from phase $\theta_1$ to phase $\theta_2$. Digital logic (not shown) of the second RSD stage generates the $V_{refp}$ and $V_{refm}$ signals coupled respectively to the second and third inputs of configurable block 100. A voltage $V_{refp}$, 0, or $V_{refm}$ is provided to configurable block 100 that corresponds to the magnitude of the residue provided by the first RSD stage which aids in the calculation of the residue from the 1.5 bit MDAC. Capacitors 106 and 107 are decoupled from amplifier 101. The first and second terminals of capacitor 106 and 107 are coupled to the voltage VCM thus storing no voltage. Capacitor 103 is coupled to receive a voltage $V_{refp}$, 0, or $V_{refm}$. Similarly, capacitor 104 is coupled to receive a voltage $V_{refp}$, 0, or $V_{refm}$. Capacitor 102 is coupled between the negative input and positive output of amplifier 101. Capacitor 105 is coupled between the positive input and the negative output of amplifier 101. Configurable block 101 as the 1.5 bit MDAC is placed in a state that is ready to calculate a residue.

Referring back to FIG. 8, the clock to RSD stage2 transitions repeatedly transitions from a phase $\theta_1$ to a phase $\theta_2$. In each phase $\theta_1$ bit value is calculated by the second RSD stage and in phase $\theta_2$, configurable block 100 as the 1.5 bit multiplying analog to digital converter (MDAC) generates a residue that is provided back to the first RSD stage. The conversion cycles back and forth between the first and second RSD stages calculating a bit value each half clock cycle. The number of clock cycles of clock to RSD stage 2 determines the resolution of the digital word generated corresponding to the sampled input analog voltage. A next sample/conversion cycle begins when the sample signal transitions from the low logic state to a high logic state and the clock to RSD stage2 signal is forced to a low logic state.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A cyclic analog to digital (A/D) converter comprising:
    a block having an input, a clock input, a differential input, a bit output, a differential output, and a differential amplifier; and
    a first redundant signed digit (RSD) stage having a differential input coupled to said differential output of said block, the clock input, a bit output, and a differential output coupled to said differential input of said block wherein said block is configured as a sample/hold circuit for sampling an analog signal and wherein said block is then configured as a second redundant signed digit stage for generating a logic value and a residue during a conversion process, wherein said differential amplifier is used in a multiplying digital to analog converter for generating said residue when said block is configured as said redundant signed digit stage.

2. The cyclic analog to digital (A/D) converter of claim 1 wherein said block configured as a redundant signed digit stage further includes:
    a flash quantizer having a differential input coupled to said differential input of said block, a first output, and a second output; and
    a block of digital logic having a first input and a second input coupled respectively to said first and second outputs of said flash quantizer, and an output coupled to said multiplying digital to analog converter.

3. The cyclic analog to digital (A/D) converter of claim 2 wherein said block configured as said sample/hold circuit samples a single-ended analog signal applied to said input of said block.

4. The cyclic analog to digital (A/D) converter of claim 3 wherein said sample/hold circuit scales and converts a sampled single-ended analog signal to a differential signal.

5. The cyclic analog to digital (A/D) converter of claim 4 wherein said first redundant signed digit stage receives said differential signal, generates a first logic value corresponding to said differential signal, and calculates a first residue.

6. The cyclic analog to digits (A/D) converter of claim 5 wherein said block is converted from said sample/hold circuit to said second redundant signed digit stage and receives said first residue from said first stage and wherein said block configured as said second redundant signed bit stage generates a second logic value corresponding to said first residue and calculates a second residue that is provided to said first signed digit stage.

7. The cyclic analog to digital (A/D) converter of claim 6 wherein said conversion process cycles back and forth between said first and second redundant signed digit stages until a predetermined resolution is achieved and wherein said block is configured from said second redundant signed bit stage to said sample/hold circuit to sample said analog signal.

8. A method for converting an analog signal to a corresponding digital word comprising the steps of:
    storing a sampled voltage corresponding to the analog signal;
    scaling and converting said sampled voltage using an amplifier in a gain configuration to generate a scaled differential voltage;
    providing said scaled differential voltage to a first redundant signed digit stage for generating a first logic value corresponding to said scaled differential voltage;
    calculating a first residue voltage with said first redundant signed digit stage;
    using said amplifier in a multiplying digital to analog converter of a second redundant signed digit stage;
    coupling said first redundant signed digit stage to said second redundant stage for receiving said first residue voltage;
    generating a second logic value corresponding to said first residue with said second redundant signed digit stage; and
    calculating a second residue with said multiplying digital to analog converter of said second redundant signed digit stage.

9. The method for converting an analog signal to a corresponding digital word as recited in claim 8 wherein said step of storing a sampled voltage corresponding to the analog signal further includes the steps of:
    storing a difference voltage corresponding to the analog signal and a common mode reference voltage on a first capacitor; and
    storing a difference voltage corresponding to the analog signal and said common mode reference voltage on a second capacitor.

10. The method for converting an analog signal to a corresponding digital word as recited in claim 8 wherein said step of scaling and converting said sampled voltage using an amplifier in a gain configuration to a scaled differential voltage further includes the steps of:
    providing a voltage stored on said first and second capacitors respectively to a first input and a second input of said amplifier;
    coupling a third capacitor in a gain configuration from a first output of said amplifier to said first input; and
    coupling a fourth capacitor in said gain configuration from a second output of said amplifier to said second input wherein said scaled differential voltage is provided at said first and second outputs of said amplifier.

11. The method for converting an analog signal to a corresponding digital word as recited in claim 10 wherein said step of generating a second logic value corresponding to said first residue with said second redundant signed digit stage further includes the steps of:
    storing a difference voltage corresponding to said first residue voltage and said common mode reference voltage on said first and third capacitors; and
    storing a difference voltage corresponding to said first residue voltage and said common mode reference voltage on said second and fourth capacitors.

12. The method for converting an analog signal to a corresponding digital word as recited in claim 11 wherein said step of generating a second logic value corresponding to said first residue with said second redundant signed digit stage further includes the steps of:

coupling a fifth capacitor between said first input and said first output of said amplifier; and coupling a sixth capacitor between said second input and said second output of said amplifier.

13. The method for converting an analog signal to a corresponding digital word as recited in claim 12 wherein said step of calculating a second residue with said multiplying digital to analog converter of said second redundant signed digit stage includes the steps of:

decoupling said fifth and sixth capacitors from said amplifier;

coupling said third capacitor between said first input and said first output of said amplifier;

coupling an adjusting voltage corresponding to a magnitude of said first residue voltage to said first capacitor;

coupling a combined voltage of said adjusting voltage corresponding to said magnitude of said first residue voltage and said difference voltage corresponding to said first residue voltage and said common mode reference voltage stored on said first capacitor to the first input of said amplifier;

coupling said fourth capacitor between said second input and said second output of said amplifier;

coupling said adjusting voltage corresponding to said magnitude of said first residue voltage to said second capacitor; and coupling a combined voltage of said adjusting voltage corresponding to said magnitude of said first residue voltage and said difference voltage corresponding to said first residue voltage and said common mode reference voltage stored on said second capacitor to the second input of said amplifier wherein said second residue voltage is provided at said first and second outputs of said amplifier.

14. The method for converting an analog signal to a corresponding digital word as recited in claim 8 further including the steps of:

coupling said second redundant signed digit stage to said first redundant signed digit stage; and cycling back and forth between said first and second redundant signed digit stages for generating logic values of the corresponding digital word.

15. The method for converting an analog signal to a corresponding digital word as recited in claim 14 further including the steps of:

stopping a conversion process when a resolution of the corresponding digital has been met; and beginning a new conversion process.

* * * * *